(12) United States Patent
Membretti et al.

(10) Patent No.: US 9,733,268 B2
(45) Date of Patent: Aug. 15, 2017

(54) SYSTEMS AND METHODS TO DETERMINE STICTION FAILURES IN MEMS DEVICES

(71) Applicant: Maxim Integrated Products, Inc., San Jose, CA (US)

(72) Inventors: Giorgio Massamiliano Membretti, Milan (IT); Roberto Casiraghi, Milan (IT); Igino Padovani, Novate Milanese (IT)

(73) Assignee: Hanking Electronics Ltd., Solon, OH (US)

( * ) Notice: Subject to any disclaimer, the term of this patent is extended or adjusted under 35 U.S.C. 154(b) by 189 days.

(21) Appl. No.: 14/185,672

(22) Filed: Feb. 20, 2014

(65) Prior Publication Data

US 2015/0096377 A1    Apr. 9, 2015

Related U.S. Application Data

(60) Provisional application No. 61/887,880, filed on Oct. 7, 2013.

(51) Int. Cl.
| | |
|---|---|
| *G01P 15/125* | (2006.01) |
| *G01C 21/00* | (2006.01) |
| *B81C 1/00* | (2006.01) |
| *G01P 21/00* | (2006.01) |
| *G01P 15/08* | (2006.01) |

(52) U.S. Cl.
CPC ........ *G01P 15/125* (2013.01); *B81C 1/00976* (2013.01); *G01P 21/00* (2013.01); *G01P 2015/0871* (2013.01); *G01P 2015/0874* (2013.01)

(58) Field of Classification Search
CPC .... G01P 15/125; G01P 15/0802; G01P 15/08; G01C 19/56; B81C 1/00976
USPC .............. 73/514.32, 514.38, 504.12, 504.14
See application file for complete search history.

(56) References Cited

U.S. PATENT DOCUMENTS

| | | | | |
|---|---|---|---|---|
| 4,336,718 | A * | 6/1982 | Washburn ............. | G01P 15/132 318/632 |
| 6,070,464 | A * | 6/2000 | Koury, Jr. ........... | G01P 15/0802 73/1.38 |
| 8,215,151 | B2 * | 7/2012 | Sammoura .......... | B81C 99/0045 324/548 |
| 8,596,123 | B2 * | 12/2013 | Schultz ................ | B81B 3/0016 73/514.32 |
| 8,661,871 | B2 * | 3/2014 | Tripoli .................. | G01C 19/56 333/186 |

(Continued)

FOREIGN PATENT DOCUMENTS

EP        2439172      *   4/2012

*Primary Examiner* — Helen Kwok
(74) *Attorney, Agent, or Firm* — Hartman Global IP Law; Gary M. Hartman; Domenica N. S. Hartman

(57) ABSTRACT

Various embodiments of the invention provide for stiction testing in MEMS devices, such as accelerometers. In certain embodiments, testing is accomplished by a high voltage smart circuit that enables an analog front-end circuit to accurately read the position of a movable proof-mass relative to a biased electrode in order to allow the detection of both contact and release conditions. Testing allows to detect actual or potential stiction failures and to reject defective parts in a Final Test stage of a manufacturing process where no other contributors to stiction issue can occur, thereby, minimizing stiction failure risks and extending the reliability of MEMS devices.

19 Claims, 8 Drawing Sheets

(56) References Cited

U.S. PATENT DOCUMENTS

| | | | |
|---|---|---|---|
| 8,948,706 B2* | 2/2015 | Napoles | B81C 1/00976 |
| | | | 455/73 |
| 2007/0075942 A1* | 4/2007 | Martin | B81C 1/00968 |
| | | | 345/84 |
| 2007/0090902 A1* | 4/2007 | Deligianni | H01H 59/0009 |
| | | | 335/78 |
| 2009/0145230 A1* | 6/2009 | Ikeuchi | G01C 19/5719 |
| | | | 73/514.32 |
| 2013/0319076 A1* | 12/2013 | Moreau | B81C 1/00968 |
| | | | 73/1.38 |
| 2014/0260515 A1* | 9/2014 | Hazel | G01P 21/00 |
| | | | 73/1.38 |
| 2014/0345380 A1* | 11/2014 | Jia | B81B 3/0016 |
| | | | 73/514.32 |

* cited by examiner

SYSTEMS AND METHODS TO DETERMINE STICTION FAILURES IN MEMS DEVICES

CROSS REFERENCE TO RELATED PATENT APPLICATIONS

The present application claims priority to U.S. Provisional Application Ser. No. 61/887,880, titled "Systems and Methods to Determine Stiction Failures in MEMS Devices," filed on Oct. 7, 2013 by Giorgio Massimiliano Membretti, Roberto Casiraghi, and Igino Padovani, which application is hereby incorporated herein by reference in its entirety.

BACKGROUND

A. Technical Field

The present invention relates to integrated micromechanical systems and, more particularly, to systems, devices, and methods of reducing stiction failures in Micro Electro Mechanical System (MEMS) sensors.

B. Background of the Invention

Stiction phenomena are well-known problems in MEMS type devices with movable parts. Stiction effects typically occur between two surfaces when an external force deflects a movable part in a manner so as to cause its surface to come in physical contact and adhere to the surface of an adjacent stationary part.

Sensor type MEMS devices are particularly vulnerable to stiction, which may occur intermittently during regular use of the device or during the manufacturing process. Stiction adversely affects device performance and may be caused by a variety of forces including capillary forces caused by the presence of moisture and van der Waals forces caused by surface contamination, such as polishing residuals that may fluctuate depending on surface preparation processes.

For example, in a MEMS accelerometer sensor, an external disturbance such as a mechanical shock may deflect a suspended proof-mass in a manner so as to cause a portion of its surface to contact and adhere to an adjacent wafer substrate surface. When the total adhesion force between the two surfaces is higher than the mechanical restoring force inherent to the proof-mass, stiction occurs and temporarily immobilizes the proof-mass and prevents it from recovering its original position even after the external disturbance ceases to act on the sensor. This prevents the accelerometer from producing an accurate acceleration signal, until the stiction force is overcome, for example, by a sufficiently large counteracting force.

Since stiction causes the proof-mass to adhere to the substrate, the two parts are no longer separated from each other, blocking the movement of the proof mass and, in some cases, also causing a short circuit event that destroys the electric field between the two surfaces. Therefore, the sensor can no longer measure capacitive changes to derive an acceleration value during the time the stiction condition is present, which affects both device reliability and performance.

Some prior art approaches allow to improve stiction robustness of a MEMS device, for example, by increasing material stiffness and, thus, the mechanical restoring force in order to aid releasing the adhered parts of the device. Other approaches seek to improve surface conditions during the fabrication process in order to minimize stiction. However, such improvements result from design tradeoffs that come at the cost of reduced device performance, increased device size, and/or increased cost of manufacturing. What is needed are tools for MEMS designers to overcome the above-described limitations without increasing device size or sacrificing device performance.

SUMMARY OF THE INVENTION

The disclosed systems and methods increase reliability of MEMS devices by allowing to detect and screen out from a production batch units that suffer from actual stiction or are prone to stiction effects, for example, resulting from surface contamination during the manufacturing process. Detection involves performing a stress test that aids in identifying existing or expected stiction failures.

In certain embodiments, a high voltage smart circuit allows to select between a regular acceleration reading mode and a stiction test mode of operation using a stress test apparatus. The stress test apparatus comprises dedicated circuitry configured to selectively apply a voltage to a fixed electrode to generate an electrostatic force that attracts a movable proof-mass within the MEMS device in a manner so as to cause contact between the movable mass and a stationary part. In one embodiment, the dedicated circuitry comprises an external high voltage source configured to apply a high voltage to one or more fixed electrodes to induce the contact. The dedicated circuitry protects the main front-end from overvoltage stress when the sensor is coupled to the high voltage source.

In one embodiment, the stress test comprises directly or indirectly determining a capacitance value between the movable part and a fixed electrode, e.g., from a position of the movable part in relation to the fixed electrode. Once the voltage is removed, information about existing or future stiction events, including the causes and the severity of the stiction can be obtained. In some embodiments, the voltage is removed gradually to generate a hysteresis curve from which additional information may be obtained that allows for characterization and in-depth analysis of a particular stiction effect.

Certain features and advantages of the present invention have been generally described here; however, additional features, advantages, and embodiments presented herein will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that this is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention. In this document mass and seismic mass are used interchangeably.

Figure 1A:
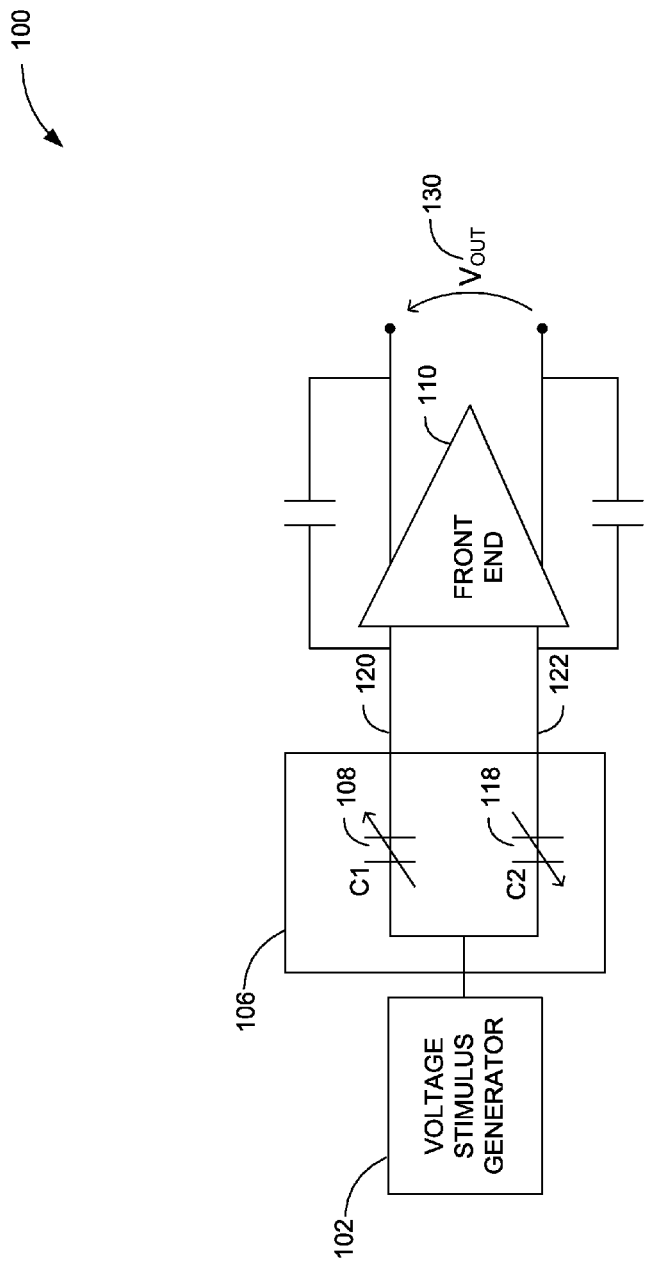
FIG. 1A shows a block diagram of a prior art MEMS sensor front-end readout circuit.

FIG. 1A shows a block diagram of a prior art MEMS sensor front-end readout circuit 100. Circuit 100 comprises voltage stimulus generator 102, MEMS sensor 106, and low-noise main front-end amplifier 110. Voltage stimulus generator 102 is coupled to MEMS sensor 106, which outputs differential sense signals 120, 122 to front-end amplifier 110. In this example, MEMS sensor 106 is an accelerometer sensor configured to read out the position of a proof-mass (not shown) and, in response, output voltage $V_{OUT}$ 130.

In operation, voltage stimulus generator 102 provides a voltage stimulus to electrodes (not shown) within sensor 106 to determine variations in differential capacitance 108, 118. MEMS sensor 106 generates differential output signal 120, 122 in response to receiving acceleration information from the sensor electrodes. Front-end amplifier 110 amplifies signal 120, 122 to generate output signal $V_{OUT}$ 130.

Figure 2:
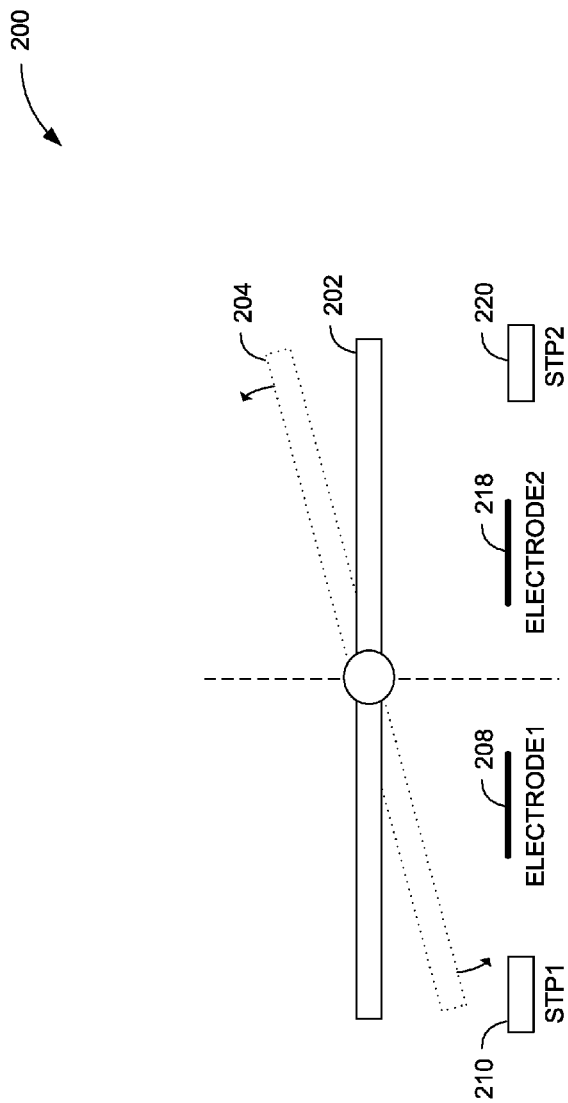
FIG. 2 shows a prior art MEMS sensor for differential readout.

FIG. 2 shows a prior art MEMS sensor for differential readout. MEMS sensor 200 comprises movable proof-mass 202, sensing electrodes 208, 218 and stopper electrodes 210, 220. Movable mass 202 typically is a seismic proof-mass that is anchored to a substrate on which MEMS sensor 200 is constructed. The anchor suspends seismic mass 202 and separates it from the substrate (not shown). Mass 202 is configured to pivot around center 206. The solid line indicates an initial position prior to the application of an electrostatic force.

Upon application of a bias voltage to either sensing electrode 208, 218, movable mass 202 rotates clockwise or counterclockwise due to an electrostatic force. If the voltage is applied to electrode 1 208, movable mass 202 will rotate counterclockwise from its initial position, such that the left end is rotated towards stopper electrode 210, as indicated by dotted line 204. Conversely, if a voltage is applied to electrode 2 218, movable mass 202 will rotate clockwise towards stopper electrode 220. Each stationary stopper electrode 210, 220 serves as a contact surface that stops the rotational movement of mass 202 when the movement of sensor MEMS sensor 200 becomes too large, for example, during phases of very high acceleration due to heavy oscillation or mechanical shock.

Once sensor electrodes 208, 218 are biased, electrostatic forces due to the charge on the plates of the capacitive electrodes add to the total force applied to proof-mass 202. The net electrostatic force $F_{el}$ can be expressed by equation:

$$F_{EL} = a_x(V_{E1+} - V_M)^2 - a_{-x}(V_{E2-} - V_M)^2$$

where $V_{E1+}$ and $V_{E2-}$ are bias voltages; and $V_M$ is the stimulus applied to mass 202, and coefficients $a_x$ and $a_{-x}$ are proportionality factors that depend on the particular geometry of sensor 200, e.g., the gap between proof-mass 202 and sensor electrodes 208, 218.

Ideally, the sum of the electrostatic forces applied to electrodes 208, 218 are balanced, such that the net force of the mechanical system cancels out. As a result, the application of the bias voltage should not cause any additional forces on the proof mass that possibly create perturbations and negatively impact the readout voltage $V_{OUT}$.

During a stiction condition, the contact force between movable mass 202 and the surface of stopper 210 will be larger than a restoring force of movable mass 202, such that movable mass 202 will not be able to return to its nominal position, until the restoring force exceeds the stiction force in response to, for example, a subsequent shock that releases the two surfaces.

Existing approaches to minimize the occurrence of stiction events include increasing restoring force of proof-mass 202 in order to counteract stiction forces. Typically, the restoring force is proportional to the stiffness of the material of movable mass 202. Since material stiffness, in turn, is a function of the elasticity of both material and geometry, designing and fabricating seismic mass 202 with an appropriate stiffness can increase the restoring force. However, one drawback of this approach results from the fact that a stiffer seismic mass 202 adversely affects sensitivity of the signal to be measured due to reduced deflection of the material thereby limiting the sensitivity of the accelerometer.

One approach to minimize stiction involves optimizations at the system design level, e.g., the minimizing of electrostatic forces during normal operation while the accelerometer is being read out. Another approach to minimize stiction forces between electrodes targets manufacturing processes and surface conditioning. For example, in order to decrease the contact area between two surfaces that have a tendency adhere to each other, the surface roughness of, e.g., stopper 210, 220 and movable mass 202, is increased in order to reduce adhesion forces between the layers of material. In this context, anti-stiction materials can be used in the fabrication process in order to decrease the likelihood of stiction events. However, such process solutions are cost intensive and typically do not lend themselves to mass production for high volume markets.

Therefore, it would be desirable to have systems and methods that allow to detect and screen out defective sensors and anomalous process lots that are prone to suffer from stiction failures.

Figure 3A:
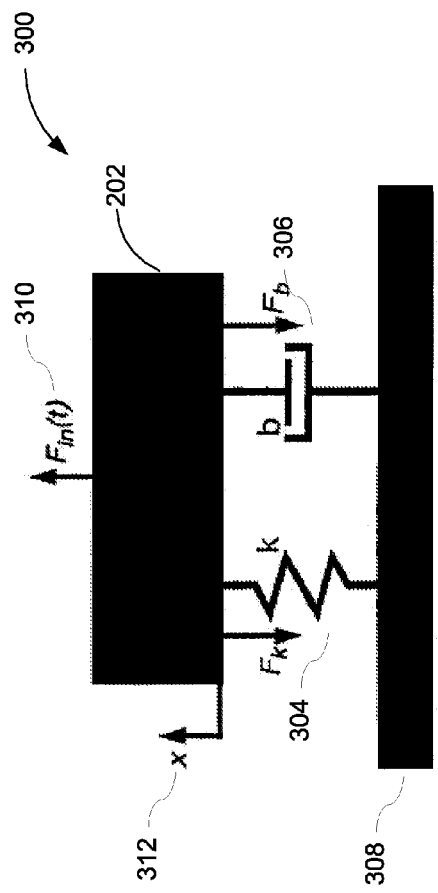
FIG. 3A shows a general mechanical model representing MEMS sensor in FIG. 2.

FIG. 3A shows a general mechanical model representing MEMS sensor in FIG. 2. Sensor 300 is an inertial MEMS accelerometer sensor. The mechanical model represents a harmonic resonator having a natural resonant frequency. The resonator comprises proof-mass 202, spring 304, and damping element 306. As shown in FIG. 3A, proof-mass 202 is connected to a parallel configuration of spring 304 and damping element 306. The parallel configuration is anchored to substrate 308. Proof-mass 202 is characterized by mass m, spring 304 is characterized by spring constant k, and damping element 306 is characterized by damping coefficient b.

Displacement 312 is characterized by a movement in position, x, of proof-mass 202 resulting from inertial acceleration force Fin(t) 310 acting on proof-mass 202. Displacement 312 can be capacitively measured and converted into a measured acceleration value. In addition to gravity, the sum of acceleration force, spring force $F_k$, and damping force $F_b$ determine the total time-varying force F(t) that acts on proof-mass 202. Force F(t) is related to displacement 312 of proof-mass 202 in the mechanical model of sensor 300 through the following second order differential equation:

$$F(t) = m\ddot{x} + b\dot{x} + kx$$

which can be solved by numerical analysis.

Figure 3B:
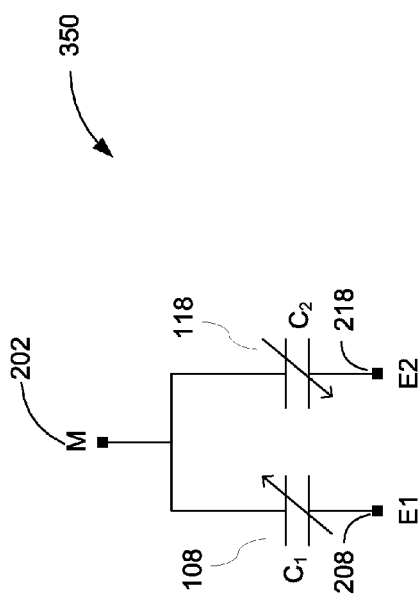
FIG. 3B shows a general electrical equivalent circuit representation of the MEMS sensor shown in FIG. 3A.

FIG. 3B shows a general electrical equivalent circuit representation 350 of the MEMS sensor shown in FIG. 3A. The electrical model comprises a pair of parallel variable capacitors 108, 118 that are typically coupled between movable mass 202, which has an inertial resistance to acceleration, and a sensing circuit (not shown) coupled to capacitors 108, 118. The variation of the differential capacitance of capacitors 108, 118 is related to the movement of movable mass 202.

Figure 4:
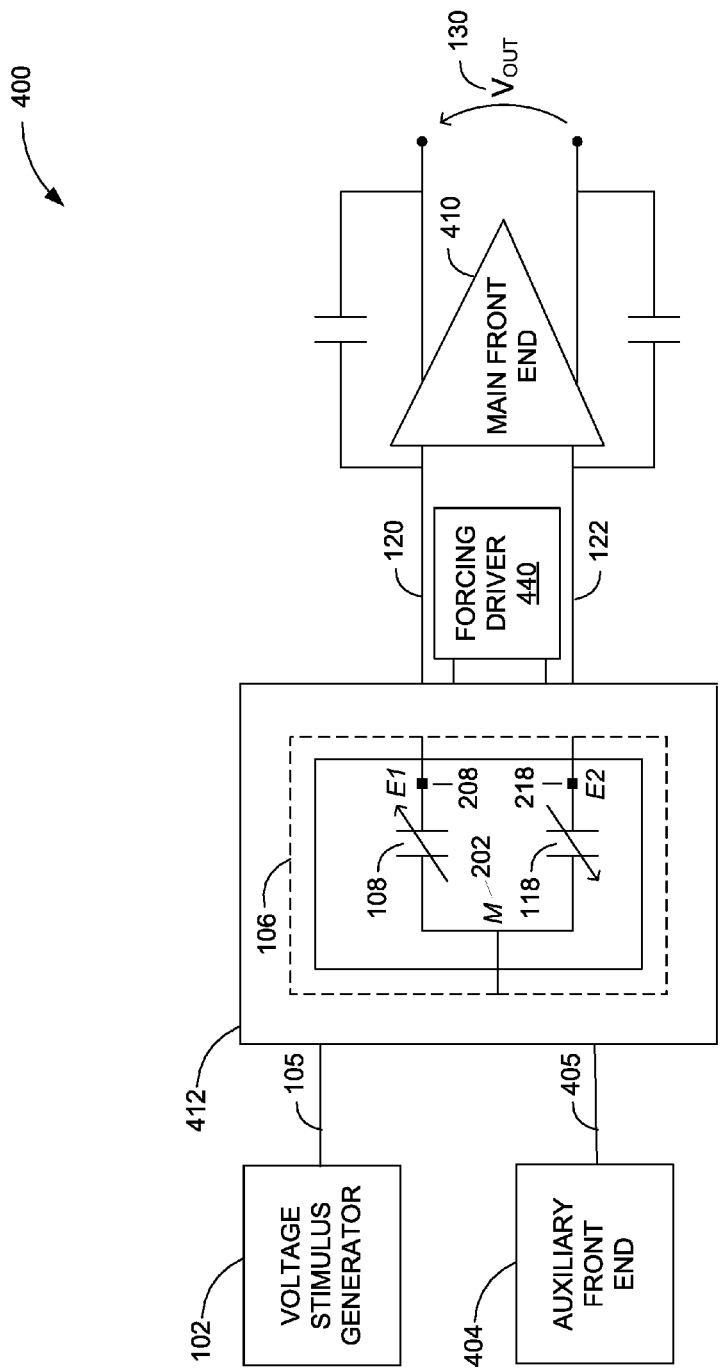
FIG. 4 illustrates an exemplary block diagram of a testing system to detect stiction failures in a MEMS sensor, according to various embodiments of the invention.

FIG. 4 illustrates an exemplary block diagram of a testing system to detect stiction failures in a MEMS sensor, according to various embodiments of the invention. System 400 comprises voltage stimulus generator 102, MEMS sensor 106, auxiliary front-end circuit 404, high-voltage smart circuit 412, forcing driver 440, and main front-end amplifier 410. Both forcing driver 440 and main front-end amplifier 410 are selectively coupled to MEMS sensor 106. Similarly, voltage stimulus generator 102 and auxiliary front-end circuit 404 are selectively coupled to MEMS sensor 106 via high-voltage smart circuit 412. MEMS sensor 106 may be a capacitive MEMS accelerometer sensor similar to FIG. 1 and comprises movable proof-mass M 202, which is capacitively coupled to fixed electrodes 208, 218 forming a capacitive bridge that is configured to read out the position of movable mass 202 and output differential output signal 120, 122.

In one embodiment, in regular acceleration reading mode, voltage stimulus generator 102 and main analog front-end amplifier circuit 410 are coupled to MEMS sensor 106, while auxiliary front-end circuit 404 and forcing driver 440 are decoupled from MEMS sensor 106. In this embodiment, voltage stimulus generator 102 provides voltage stimulus 105 that is applied to movable mass 202 of sensor 106. Electrodes 208, 218 are coupled to main front-end amplifier circuit 410, which determine variations in the capacitance of sensor electrodes 208, 218. The capacitive imbalance between movable mass 202 and electrodes 208, 218 generates differential readout signal 120, 122 that is output by the capacitive bridge. Main front-end amplifier circuit 410 is a low-noise analog amplifier that receives signal 120, 122 and amplifies it to generate output signal $V_{OUT}$ 130 from which an acceleration value can be extracted.

During operation in stiction test mode, both auxiliary front-end circuit 404 and forcing driver 440 are coupled to MEMS sensor 106, while voltage stimulus generator 102 and main front-end amplifier circuit 410 are decoupled from to MEMS sensor 106. In one embodiment, forcing driver 440 alternately applies a relatively high voltage to electrodes 208, 218 to generate an electrostatic force that selectively rotates movable mass 202 closer to one of the two fixed electrodes 208, 218. Forcing driver 440 may be implemented as an external high voltage source that employs an algorithm to gradually increase and decrease the bias voltage.

In this example, auxiliary front-end circuit 404 is coupled via path 405 to movable mass 202 to detect a distance between movable mass 202 and each of electrode 208, 218, for example, by selectively sensing the absolute capacitance value between movable mass 202 and the respective electrode 208, 218. The capacitance value, which, by definition, is a function of geometry, is representative of the relative position between movable mass 202 and the respective electrode 208, 218. In one embodiment, the obtained capacitance value is used to determine whether contact has occurred between moving and stationary parts.

Switching between modes of operation is accomplished by high voltage smart circuit 412. During stiction test mode, forcing driver 440 applies a relatively high voltage (e.g., >5V) to electrode 208, 218 that provides an electrostatic force to sensor 106 in order to cause contact between movable mass 202 and one of electrode 208, 218. However, such a high voltage range is generally not tolerated by analog main front-end 410, which is typically designed as a low voltage (e.g., <2V) circuit. As will be further explained with respect to FIG. 5, the operation of voltage smart circuit 412 protects main front-end circuit 410 from overvoltage stress.

One of ordinary skill in the art will appreciate that any known method be used to approximate a change in capacitance. For example, instead of a voltage, a current or a charge may be used from which variations in capacitance may be determined.

Figure 5:
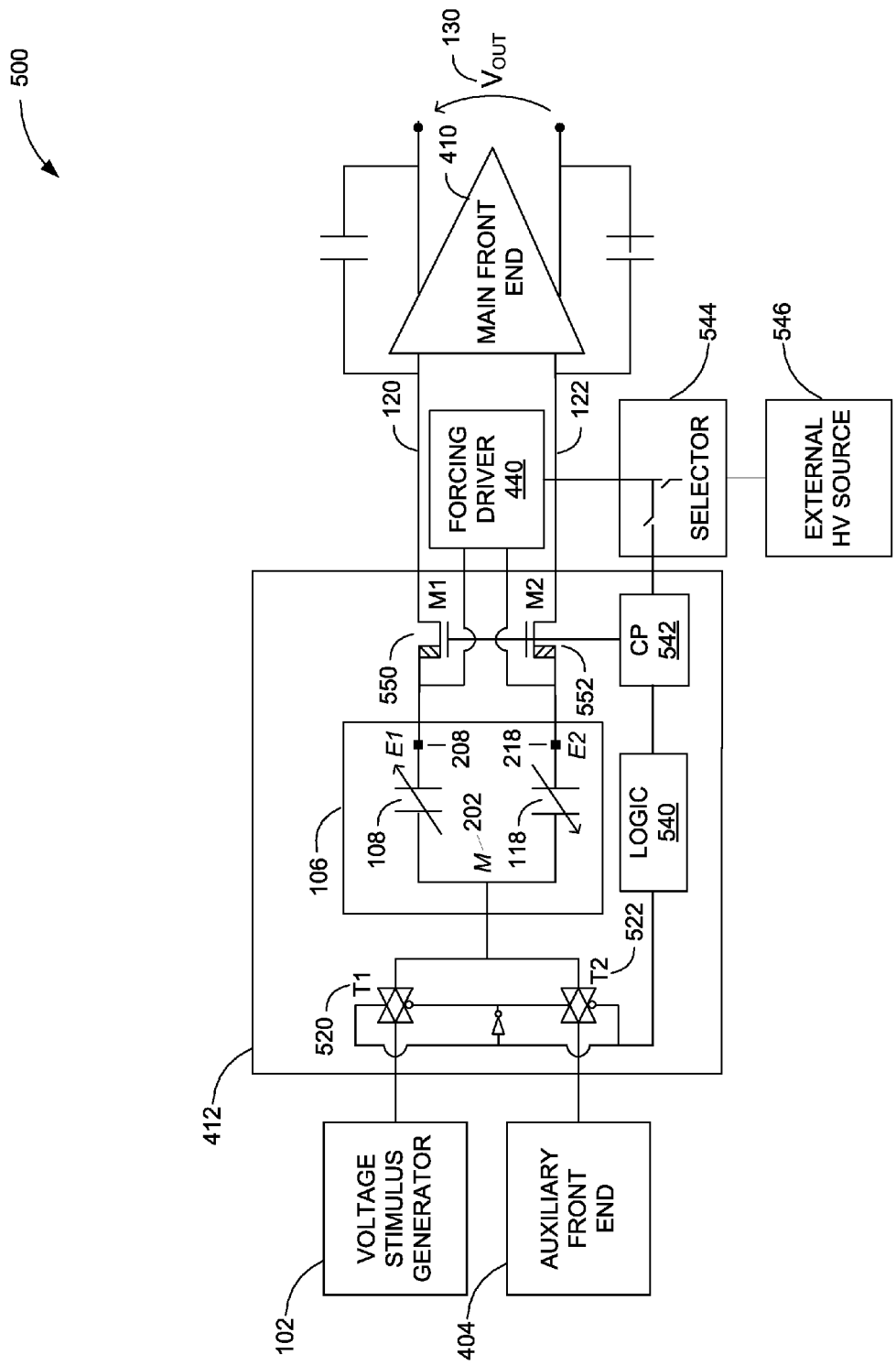
FIG. 5 depicts the testing system of FIG. 4 utilizing a high voltage control circuit, according to various embodiments of the invention.

FIG. 5 depicts the testing system of FIG. 4 utilizing a high voltage control circuit, according to various embodiments of the invention. For clarity, components similar to those shown in FIG. 4 are labeled in the same manner. For purposes of brevity, a description or their function is not repeated here.

High-voltage control circuit 412 of testing system 500 comprises MEMS sensor 106, transmission gates T1 520 and T2 522, logic circuit 540, charge pump 542, and transistor 550, 552. In this example, transistors M1 550 and M2 552 are implemented as MOSFETs. Transmission gate T1 520 is coupled between voltage stimulus generator 102 and MEMS sensor 106. Transmission gate T2 522 is coupled to auxiliary front-end circuit 404 and to MEMS sensor 106.

Logic circuit 540 is coupled between transmission gates 520, 522 and charge pump 542. In example in FIG. 5, testing system 500 comprises selector 544 that selects which of charge pump 542 or external high voltage source 546 polarizes forcing driver 440. Transmission gates T1 520 and T2 522 enable the selective coupling and decoupling of movable mass 202 to voltage stimulus generator 102 and auxiliary front-end circuit 404, respectively. Logic circuit 540 controls the connections between MEMS sensor 106 and the interfacing electronics. Charge pump 542 controls transistors M1 550 and M2 552.

In normal acceleration reading mode, control circuit 412 controls charge pump 542 to turn on transistors M1 550 and M2 552. This allows acceleration signal 120, 122 to be forwarded to the input terminals of main front-end circuit 410. Conversely, in stiction test mode, transistor 550, 552 is switched off to protect the inputs of main front-end from the high voltage generated by forcing driver 440. Transistor 550, 552 is designed such that in its off state it can withstand the relatively higher voltage impressed by forcing driver 440. Charge pump 542 is designed to operate high voltage transistors M1 550 and M2 552, which require a higher gate voltage (>2V) to be switched on when compared to the low voltage transistors used in existing front-end interface designs, which are driven by power supply voltages below 2 V. One advantage of utilizing an external high-voltage circuit 546 to bias forcing driver 440 when operating in stiction test mode is that if the test is performed, for example, only once during the final stages of the manufacturing process, control circuit 412 can be designed with less components and, thus, more cost efficient.

Figure 6:
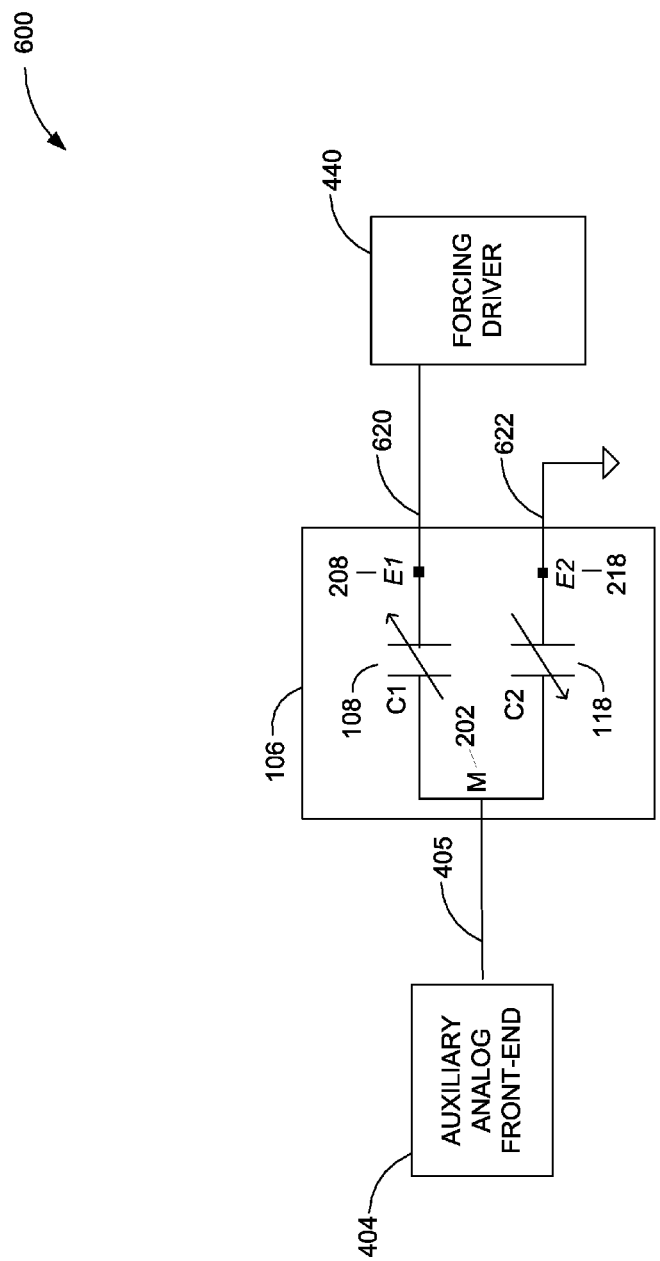
FIG. 6 depicts aspects of the testing system during stiction test mode, according to various embodiments of the invention.

In detail, FIG. 6 depicts aspects of the testing system during stiction test mode, according to various embodiments of the invention. System 600 comprises MEMS sensor 106 that is coupled between auxiliary front-end circuit 404 and forcing driver 440. Movable mass 202 within sensor 106 is coupled to electrode 208, 218 through capacitance C1 108 and C2 118.

In operation, forcing driver 440 is controlled to apply a bias voltage to one of electrodes 208, 218, while no voltage or a zero voltage is applied to both the other electrode and movable mass 202. In the example in FIG. 6, forcing driver 440 applies a voltage, $V_{El}$, to the terminal 620 of electrode E1 208 while the terminal 622 of electrode E2 218 is grounded. It is noted that while $V_{El}$ is applied to electrode E1 208 instead of grounding electrode E2 218, a second voltage, $V_{E2}$, may be applied to electrode E2 218, whereby $V_{E2}$ is equal to and opposite in magnitude to a stimulus voltage 105 (VM) that is applied by auxiliary front-end circuit 404 to movable mass 202.

Referring to FIG. 2, a bias voltage applied to electrode E1 208 will generate an electrostatic force between movable mass 202 and electrode E1 208 that causes movable mass 202 to rotate counterclockwise. The applied voltage, which is proportional to the square root of the electrostatic force, attracts the two parts, and given a sufficiently high bias voltage, movable mass 202 will rotate until it contacts stationary stopper electrode 210 (labeled STP1 in FIG. 2). Therefore, unlike during regular operation where an equal bias voltage is applied to both electrodes in order to generate a force balance, the objective in this embodiment is not to balance the electrostatic forces. As a result, the equation previously mentioned with respect to FIG. 2 that describes the net electrostatic force $F_{el}$ simplifies to the following expression:

$$F_{EL} = a_X(V_{E1+})^2$$

wherein $V_{E1+}$ is the bias voltage applied to electrode E1 208. Likewise, when a bias voltage is applied to electrode E2 218, the electrostatic force between movable mass 202 and electrode E2 218 will cause movable mass 202 to rotate clockwise. In this scenario, the net electrostatic force $F_{e1}$ can be expressed by:

$$F_{EL} = -a_{-X}(V_{E2-})^2$$

Once the bias voltage, i.e., the electrostatic force is removed, it is possible to determine whether the contact surfaces are prone to stiction by examining the response of structure 200. If, for example, moveable mass 202 remains in contact with stopper electrode 1 210 after the electrostatic force has been disengaged, for example, due to strong Van der Waals forces between the surfaces caused by process residuals on the surface of stopper electrode 1 210, sensor 200 would be deemed to have a potential stiction issue. Conversely, if moveable mass 202 recovers its initial position after the removal of the electrostatic force, it may be concluded that sensor 200 is not likely to be prone to stiction.

In one embodiment, the position of moveable mass 202 is determined via a dedicated capacitive sensing. Returning to FIG. 6, auxiliary front-end circuit 404 alternately detects via path 405 the capacitance value between proof-mass 202 and electrode E1 208 and between proof-mass 202 and electrode E2 218 to detect the position of movable mass 202 during stiction test mode.

Auxiliary front-end circuit 404 may comprise an ordinary charge sensing amplifier with a feedback capacitor that transforms the capacitance into a voltage signal. However, this is not intended as a limitation. A person of ordinary skill in the art will appreciate that any method of capacitive sensing may be used to determine the position of movable mass 202 in order to determine the presence of a stiction condition.

Figure 7A:
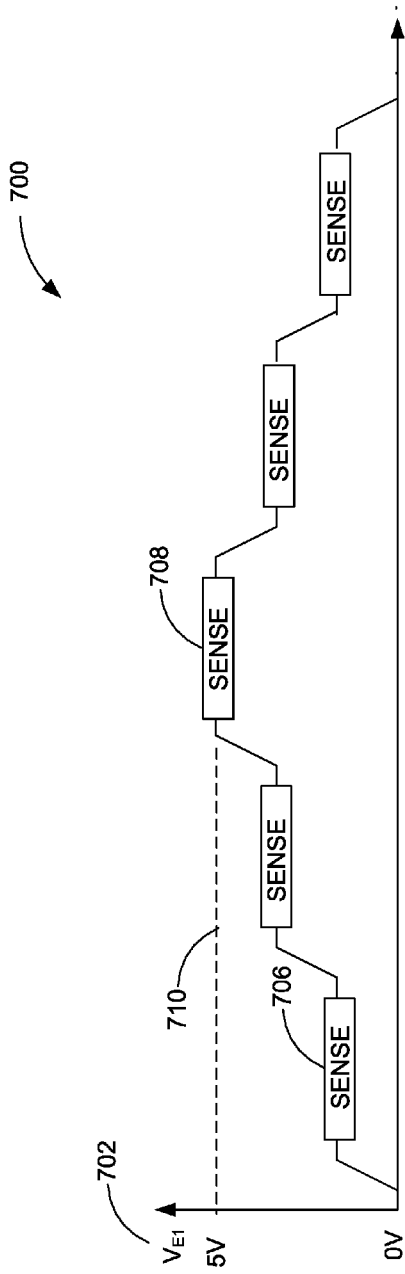
FIG. 7A illustrates an exemplary procedure for performing a stiction test according to various embodiments of the invention.

FIG. 7A illustrates an exemplary procedure for performing a stiction test according to various embodiments of the invention. As shown in FIG. 7A, electrode E1 is selected for stiction testing. First, voltage $V_{E1}$ 702 is applied to the selected electrode via a voltage source, e.g., the forcing driver shown in FIG. 6. The voltage source gradually increases voltage $V_{E1}$ 702 in discrete steps 706, such that at each step a capacitance value can be measured, for example, by using the auxiliary front-end circuit shown in FIG. 6 to measure a second voltage that is proportional to the capacitance value. The magnitude of voltage 702 required to rotate the movable mass is a function of the design of the spring-mass system. For example, higher material stiffness of the movable mass will require a higher voltage 702 and electrostatic force to generate a rotation.

Figure 7B:
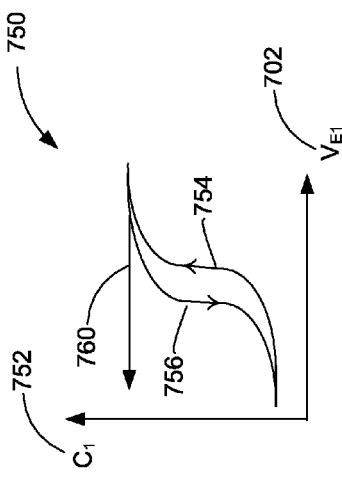
FIG. 7B illustrates an exemplary C/V curve for characterizing MEMS structures according to various embodiments of the invention.

As shown in FIG. 7B, once an increase in bias voltage $V_{E1}$ 702 no longer leads to further increases in measured capacitance C1 752, this indicates that a maximum or final capacitance value 752 is reached. At this point, the voltage source may be controlled to gradually decrease voltage $V_{E1}$ 702 in discrete steps, while the measurement circuit continues to measure capacitance C1 752. Due to adhesion effects between the two surfaces, however, the relationship between bias voltage $V_{E1}$ 702 applied to the selected electrode and the measured capacitance value C1 752 may not be reversible, but rather result in a hysteresis effect as voltage $V_{E1}$ 702 is decreased.

A shown in FIG. 7B, the reverse path of C/V curve 750 may exhibit a hysteresis resulting from surface forces that continue to act on the two parts and keep them in contact until voltage $V_{E1}$ 702 is sufficiently lowered, such that the parts can overcome the surface forces and separate, thereby, decreasing capacitance C1 752.

From hysteresis curve 750, a control logic may then determine that an adhesion effect is present between the movable mass and the stopper electrode as a result of the contact and the surface forces. The movable mass is not immediately released, since the surface forces continue to keep the two parts in contact, until voltage $V_{E1}$ 702 and, thus, the electrostatic force is sufficiently lowered to a level below contact voltage 710 that allows for a separation of the parts.

In a scenario where the surface forces cannot be overcome, such that measured capacitance C1 752 remains at a high saturation value 760 in response to decreasing bias voltage $V_{E1}$ 702, control logic may deduce that a stiction condition is present, i.e., that stiction prevents the movable mass from regaining its original position despite a significant reduction in voltage $V_{E1}$ 702 (e.g., 0 V) and electrostatic force.

In this manner, method 700 allows to generate C/V curves 750 for each electrode of each MEMS sensor within a batch of sensors. From the C-V curve and the hysteresis between the increasing and decreasing voltage curves, a given MEMS structure may be directly or indirectly characterized in terms of sensitivity and tendency to suffer from stiction in operation. Stiction testing may also be used to measure and analyze the entire C-V curve, for example, in order to establish failure criteria that may reach from benign to catastrophic, or to characterize surface conditions, material quality, particle count, geometry, and the like. As a result, a sensor under test may be rejected as failing to meet predetermined specifications.

In one embodiment, e.g., in order to decrease testing time, instead of generating a complete C/V curve 750, a sufficiently high bias voltage $V_{E1}$ 702 is applied to each electrode under test so as to force a contact between the stopper electrode and the movable mass. Then, upon removal of voltage $V_{E1}$ 702, the auxiliary analog front-end circuit can determine whether capacitance C1 752 has changed sufficiently so that it can be concluded whether stiction has, in fact, occurred.

In one embodiment, hysteresis curve 750 is used to predict reliability. The determination of a stiction condition in combination with electrostatic forces that emulate a real application environment in which the MEMS sensor experiences the stiction condition, for example, as a consequence of a strong acceleration or a shock that causes the movable proof-mass to contact and adhere to one of the stopper electrodes allows not only for the detection of zero life time stiction failures, but also for the detection parts that are prone to suffering from stiction failures.

Figure 8:
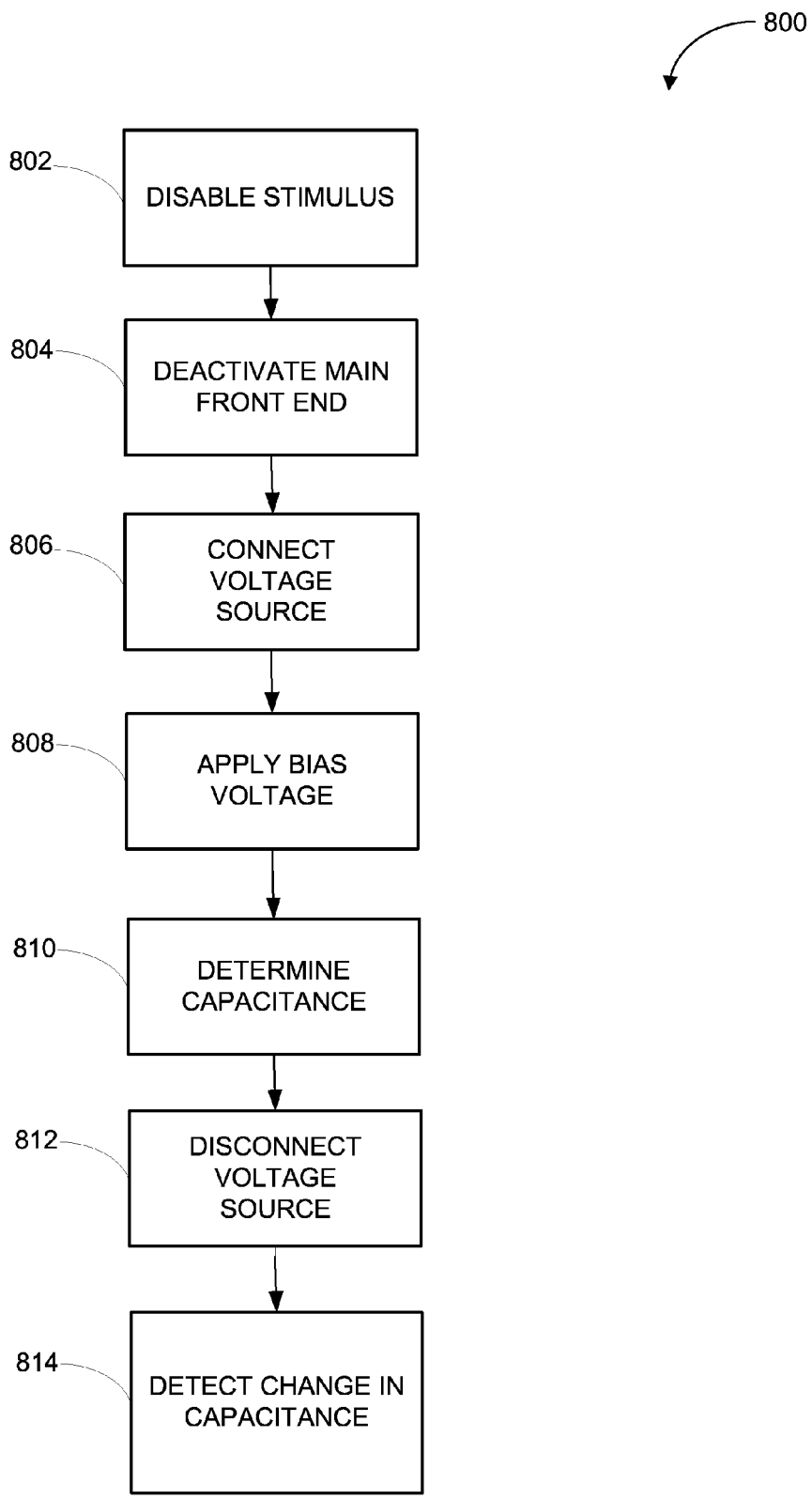
FIG. 8 is a flowchart of an illustrative process to determine stiction failures in MEMS devices in accordance with various embodiments of the invention.

FIG. 8 is a flowchart of an illustrative process to determine stiction failures in MEMS devices in accordance with various embodiments of the invention. The process 800 to determine stiction failures starts at step 802 when a stimulus signal generator is decoupled from a MEMS device.

At step 804, a first front-end circuit is decoupled from the MEMS device.

At step 806, a voltage source is connected to the MEMS device.

At step 808, a bias voltage is applied to the MEMS device, for example, via a second front-end circuit.

At step 810, a capacitance relating to the MEMS device is determined, for example, by determining a distance between a movable and a stationary part within the MEMS device.

At step 812, the voltage source is disconnected.

At step 814, a change in the capacitance value is detected to determine existing or potential stiction failures in the MEMS device.

It will be appreciated by those skilled in the art that fewer or additional steps may be incorporated with the steps illustrated herein without departing from the scope of the invention. No particular order is implied by the arrangement of blocks within the flowchart or the description herein.

It will be further appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

The invention claimed is:

1. A testing apparatus to determine stiction failure in MEMS devices, the apparatus comprising:
    a MEMS device comprising at least a first sensing electrode, at least one stopper electrode that is separate from the first sensing electrode, and a rotatable proof mass;
    a first front-end circuit coupled to the MEMS device, the first front-end circuit, in a stiction test mode in which the rotatable proof mass rotates toward the first sensing electrode and contacts the stopper electrode but not the first sensing electrode, detects a change in capacitance between the first sensing electrode and the rotatable proof mass to detect a stiction tendency between the rotatable proof mass and the stopper electrode, the first front-end circuit, in an acceleration reading mode, being decoupled from the MEMS device;
    a second front-end circuit coupled to the MEMS device, the second front-end circuit, in the acceleration reading mode, detecting a capacitance between the rotatable proof mass and the first sensing electrode;
    a forcing driver circuit that, in the stiction test mode, applies a bias voltage to the first sensing electrode to cause a contact between the stopper electrode and the rotatable proof mass; and
    a high-voltage control circuit coupled to the MEMS device, the high-voltage control circuit decoupling and coupling the first front-end circuit from the MEMS device and decoupling and coupling the forcing driver circuit from the first sensing electrode by selectively switching between the acceleration reading and stiction test modes, respectively;
    wherein in the stiction test mode the high-voltage control circuit couples the first front-end circuit and the forcing driver circuit to the MEMS device and decouples the second front-end circuit from the MEMS device, and in the acceleration reading mode the high-voltage control circuit decouples the first front-end circuit and the forcing driver circuit from the MEMS device and couples the second front-end circuit to the MEMS device.

2. The testing apparatus according to claim 1, wherein the first front-end circuit is configured to detect the change in capacitance in response to a decrease in the bias voltage.

3. The testing apparatus according to claim 1, wherein the first front-end circuit comprises a capacitive sensing circuit that detects a position of the rotatable proof mass.

4. The testing apparatus according to claim 1, further comprising a second sensing electrode that is grounded during the stiction test mode.

5. The testing apparatus according to claim 1, further comprising:
a measurement circuit configured to generate C/V curve data; and
a control logic coupled to the measurement circuit, the control logic configured to detect the contact between the stopper electrode and the rotatable proof mass.

6. A testing system to determine stiction failure in MEMS devices, the system comprising:
a MEMS device comprising first and second sensing electrodes, at least one stopper electrode that is separate from the first and second sensing electrodes, and a rotatable proof mass;
a high-voltage control circuit coupled to the MEMS device, the high-voltage control circuit selectively switches between an acceleration reading mode of operation and a stiction test mode of operation, wherein in the stiction test mode the rotatable proof mass rotates toward the first sensing electrode and contacts the stopper electrode but not the first sensing electrode;
a first front-end circuit coupled by the high-voltage control circuit to the MEMS device in the stiction test mode, the first front-end circuit, in the stiction test mode, detects a stiction tendency between the rotatable proof mass and the stopper electrode;
a second front-end circuit coupled by the high-voltage control circuit to the MEMS device in the acceleration reading mode, the second front-end circuit, in the acceleration reading mode, detects a capacitance between the rotatable proof mass and one of the first and second sensing electrodes; and
a forcing driver circuit coupled to the MEMS device, the forcing driver circuit, in the stiction test mode, alternately applies a bias voltage to one of the first and second sensing electrodes to cause contact between the rotatable proof mass and the stopper electrode;
wherein in the stiction test mode the high-voltage control circuit couples the first front-end circuit and the forcing driver circuit to the MEMS device and decouples the second front-end circuit from the MEMS device, and in the acceleration reading mode the high-voltage control circuit decouples the first front-end circuit and the forcing driver circuit from the MEMS device and couples the second front-end circuit to the MEMS device.

7. The testing system according to claim 6, further comprising a plurality of high-voltage transistors that are configured to withstand the bias voltage, and wherein the second front-end circuit is not configured to withstand the bias voltage.

8. The testing system according to claim 7, wherein the high-voltage control circuit comprises a first high-voltage source that controls the plurality of high voltage transistors.

9. The testing system according to claim 8, further comprising a selector to select between the first high-voltage source and a second high-voltage source to drive the forcing driver circuit.

10. The testing system according to claim 9, wherein the second high-voltage source is external to the testing system.

11. The testing system according to claim 6, wherein the second front-end circuit comprises circuitry to detect a distance between the rotatable proof mass and one of the first and second sensing electrodes.

12. The testing system according to claim 6, wherein the first front-end circuit comprises circuitry to detect a capacitance between one of the first and second sensing electrodes and the rotatable proof mass, the capacitance being indicative of whether contact has occurred between the stopper electrode and the rotatable proof mass.

13. The testing system according to claim 6, wherein the forcing driver circuit is configured to gradually increase and decrease the bias voltage.

14. A method to determine a stiction tendency in MEMS devices, the method comprising:
providing a MEMS device comprising a sensing electrode, at least one stopper electrode that is separate from the sensing electrode, and a rotatable proof mass, the sensing electrode being selectively coupled to first and second front-end circuits to switch between, respectively, a stiction test mode and an acceleration reading mode of operation;
decoupling the MEMS device from the second front-end circuit and coupling the MEMS device to the first front-end circuit and a forcing driver circuit to perform the stiction test mode;
applying a bias voltage with the forcing driver circuit to the sensing electrode of the MEMS device, the bias voltage causes the rotatable proof mass to rotate toward the sensing electrode and contact the stopper electrode but not the sensing electrode;
decreasing the bias voltage applied with the forcing driver circuit;
determining with the first front-end circuit a change in capacitance between the sensing electrode and the rotatable proof mass;
determining a stiction tendency between the stopper electrode and the rotatable proof mass based on the change in capacitance; and
decoupling the MEMS device from the first front-end circuit and the forcing driver circuit and coupling the MEMS device to the second front-end circuit to perform the acceleration reading mode.

15. The method according to claim 14, wherein determining the stiction tendency comprises determining whether the rotatable proof mass recovers to an initial position.

16. The method according to claim 14, wherein determining the change comprises determining a distance between the sensing electrode and the rotatable proof mass.

17. The method according to claim 14, further comprising decoupling a stimulus signal generator from the MEMS device prior to performing the stiction test mode.

18. The testing system according to claim 8, wherein the second front-end circuit is decoupled from the MEMS device in the stiction test mode and, in the acceleration reading mode, receives a readout signal and generates an output voltage therefrom.

19. The testing system according to claim 18, wherein the first high-voltage source is a charge pump that, in the acceleration reading mode, causes the plurality of high voltage transistors to switch on to allow the readout signal to be forwarded to the second front-end circuit.

* * * * *